United States Patent [19]
Botti et al.

[11] Patent Number: 5,315,268
[45] Date of Patent: May 24, 1994

[54] AUDIO POWER AMPLIFIER

[75] Inventors: Edoardo Botti, Vigevano; Claudio Tavazzani, Paiola, both of Italy

[73] Assignee: SGS-Thomson Microelectronics s.r.l., Agrate Brianza, Italy

[21] Appl. No.: 962,488

[22] Filed: Oct. 15, 1992

[30] Foreign Application Priority Data

Oct. 18, 1991 [IT] Italy ............................ T091A000787

[51] Int. Cl.$^5$ .............................................. H03F 1/52
[52] U.S. Cl. .................................. 330/298; 330/279; 330/289
[58] Field of Search ................. 330/207 P, 289, 298, 330/279; 361/103, 106

[56] References Cited

U.S. PATENT DOCUMENTS

| | | | |
|---|---|---|---|
| 4,122,400 | 10/1978 | Medendorp et al. | 330/298 X |
| 4,355,341 | 10/1982 | Kaplan | 361/79 |
| 4,564,879 | 1/1986 | Bienstman | 361/98 |
| 4,581,589 | 4/1986 | Ikoma | 330/280 |
| 4,742,312 | 5/1988 | Osburn et al. | 330/298 |

FOREIGN PATENT DOCUMENTS

| | | | |
|---|---|---|---|
| 0399276 | 11/1990 | European Pat. Off. | H03F 1/52 |
| 2637270 | 9/1977 | Fed. Rep. of Germany | H02H 7/20 |

*Primary Examiner*—James B. Mullins
*Attorney, Agent, or Firm*—Seed and Berry

[57] ABSTRACT

An amplifier comprising a power stage the output of which is compared with a reference level by a comparator. If the output exceeds the reference level, a reduction is made in the gain of a variable-gain cell upstream from the power stage. The reference level varies with temperature, and, more specifically, presents a high constant value (e.g., greater than the supply voltage) when temperature is below a predetermined threshold (e.g., 130° C.), and decreases in proportion to an increase in temperature, when the temperature exceeds the predetermined threshold. Thus, the input signal is only attenuated in the event the output signal exceeds given values inversely proportional to temperature, and with no reduction in peak output at high temperature.

18 Claims, 3 Drawing Sheets

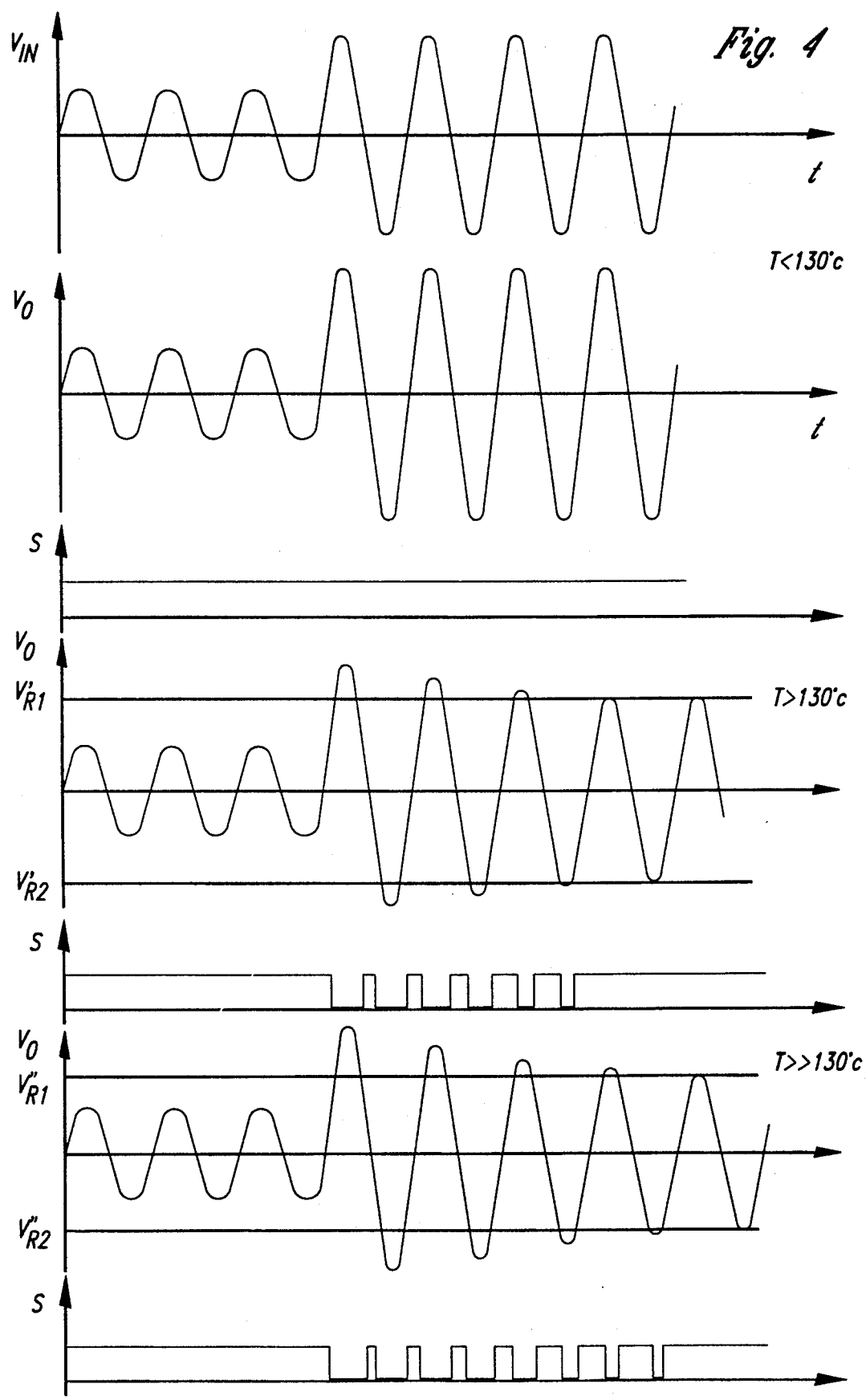

AUDIO POWER AMPLIFIER

DESCRIPTION

Technical Field

The present invention relates to a power amplifier, in particular, an audio type.

Background of the Invention

The increasing output power required of audio amplifiers poses serious problems for dissipating the heat produced. Indeed, in cases in which energy dissipation is considerable, a high ambient temperature and the small size of the heat dissipators may seriously endanger the devices. To prevent damage to the devices, thermal cutout circuits are provided for turning off certain components on the amplifier, thus cancelling or at least distorting the signal, which, in the case of audio applications, is unacceptable.

One prior art solution devised for overcoming the above problem consists in monitoring the temperature of the final stage of the amplifier, and reducing the gain of a cell upstream from the final stage when the temperature exceeds a predetermined threshold value. FIG. 1 shows a block diagram of such a solution wherein 1 indicates schematically any known type of amplifying stage featuring a temperature sensor (not shown) for generating an electric signal depending on the temperature of stage 1, and which is supplied over line 2 to a comparator 3. The comparator 3 is also supplied with a threshold signal $V_{TH}$ and, depending on the outcome of the comparison, drives, over line 4, and reduces the gain of a variable-gain cell 5 upstream from stage 1. Cell 5, the input of which is supplied with audio signal $V_{IN}$, and the output of which is connected to the input of stage 1, thus provides for reducing the level of the input signal and, consequently, the output signal $V_O$ of stage 1, when temperature exceeds the predetermined threshold defined by $V_{TH}$.

A drawback of the above solution is that, upon the temperature threshold being exceeded, the audio signal level is reduced regardless of its amplitude, thus resulting in a reduction of even an already low output (weak audio signal).

Another prior art solution is applied to amplifiers featuring clipping systems for limiting output voltage over and above a given maximum value depending on temperature, and which, more specifically, falls in proportion to an increase in temperature. In this case, provision is made for a clipping sensor, which, in the event of clipping, reduces the gain of cell 5 and, consequently, also the level of the audio signal.

A drawback of the above solution is that the reduction in the gain of cell 5 depends on the output voltage being clipped, so that the signal is not always reduced when necessary. Furthermore, the system only comes into effect when nonlinear distortion of the signal has already occurred.

SUMMARY OF THE INVENTION

It is an object of the present invention to provide a system designed to prevent power amplifiers, in particular audio types, from interrupting or distorting the output signal due to intervention of the thermal cutout device, even in the presence of high ambient temperature or undersized dissipators.

According to the present invention, there is provided a power amplifier, in particular, an audio amplifier, as claimed in claim 1.

A preferred, non-limiting embodiment of the present invention will be described by way of example with reference to the accompanying drawings, in which:

BRIEF DESCRIPTION OF THE DRAWINGS

FIG. 4 shows time graphs of a number of quantities relative to the FIG. 2 diagram.

DETAILED DESCRIPTION OF THE INVENTION

Figure 1:
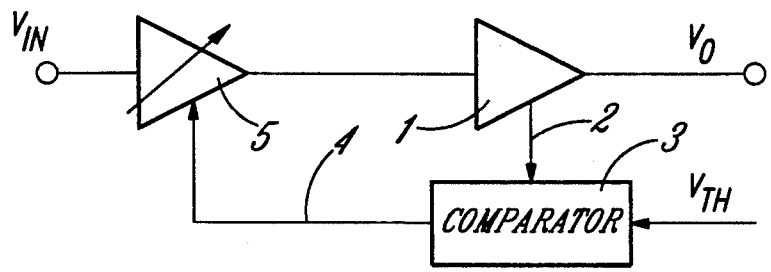
FIG. 1 shows a block diagram of a known solution.
Figure 2A:
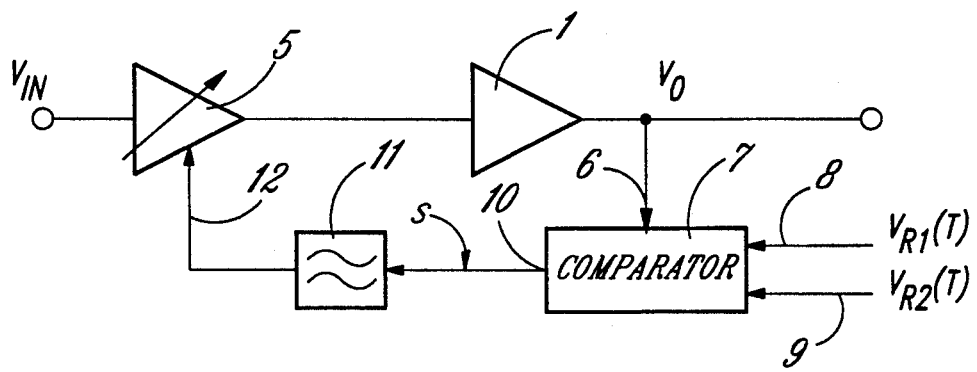
FIG. 2A shows a block diagram of an alternative embodiment of the audio amplifier according to the present invention.
Figure 2B:
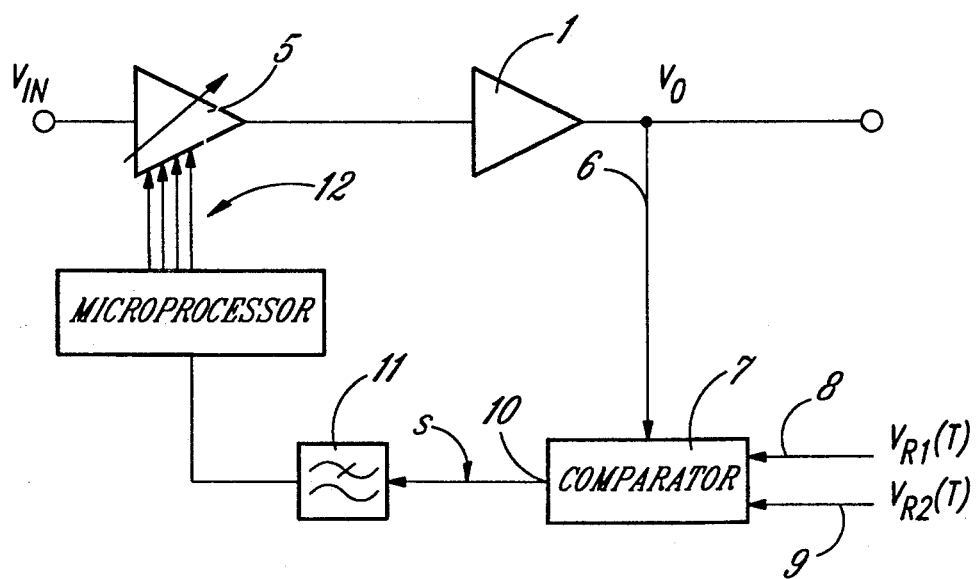
FIG. 2 shows a block diagram of one embodiment of the audio amplifier according to the present invention.

As in FIG. 1, FIG. 2 indicates any known type of power amplifier stage 1, and a variable-gain cell 5. By way of example, the stage 1 may be as described in Italian Patent Application n. 20195A/87 filed on Jan. 4, 1987 by the present Applicant, and cell 5 consist of a Gilbert circuit or microprocessor-controlled discrete-step amplifier.

In the circuit of FIG. 2, the output of the stage 1, at which output signal $V_O$ is present, is connected to input 6 of a range comparator 7 having a further two inputs 8 and 9 supplied respectively with reference voltages $V_{R1}$ and $V_{R2}$. The values of $V_{R1}$ and $V_{R2}$ vary in proportion to the temperature of stage and represent the minimum and maximum permitted values of output signal $V_O$ at a given temperature. The output 10 of comparator 7 is connected to a low-pass filter 11, which eliminates transient interference, and the output of which is connected to the control terminal 12 of variable-gain cell 5. Alternatively, the variable-gain cell 5 could be a microprocessor-controlled discreet-step amplifier as shown in FIG. 2A.

The comparator 7 checks that output signal $V_O$ falls within the range defined by reference values $V_{R1}$ and $V_{R2}$. In the event that the range is exceeded, the comparator 7 generates an output signal s of a predetermined level (e.g., logic level 0) which, filtered and integrated by filter 11, is interpreted by cell 5 as a gain reduction command. Conversely, if $V_O$ falls within the range defined by $V_{R1}$ and $V_{R2}$, comparator 7 generates a digital output signal s of opposite level (in this case, logic 1) which is interpreted by cell 5 as a command to maintain the set gain or increase it if it has already been reduced. In other words, the system so regulates itself dynamically as to maintain the output signal within the set reference values, when the input signal level and temperature are high, and restore the set gain of cell 5, when the input signal level is low or temperature falls below the set threshold.

As already stated, reference values $V_{R1}$ and $V_{R2}$ are governed by temperature, and, more specifically, fall alongside an increase in temperature as of a given threshold value. That is, as long as temperature remains below a given threshold value (e.g., 130° C.), $V_{R1}$ and $V_{R2}$ remain respectively above and below supply voltages $V_{CC}$ and $-V_{CC}$, so that the output signal remains within the range of comparator 7, the output logic level of which thus remains such (logic level 1, in the example shown) as to have no effect on the gain of cell 5. Conversely, when temperature exceeds the set threshold value, the absolute values of $V_{R1}$ and $V_{R2}$ fall so as to reduce the range of comparator 7; the maximum permitted value of the output signal is reduced; and, as compared with operation wherein T<130° C., the output signal is attenuated increasingly alongside an increase in temperature. This is shown in FIG. 4, which shows behavioral graphs of output signal $V_O$ in the presence of the same input signal $V_{IN}$, but at three different temperatures, i.e., below, slightly above, and considerably above the set threshold of 130° C. In FIG. 4, which also shows the corresponding behavior of output signal s of comparator 7, input voltage $V_{IN}$ is not to scale in relation to the three output voltage graphs, and no account is taken of the delay introduced by filter 11.

Figure 3:
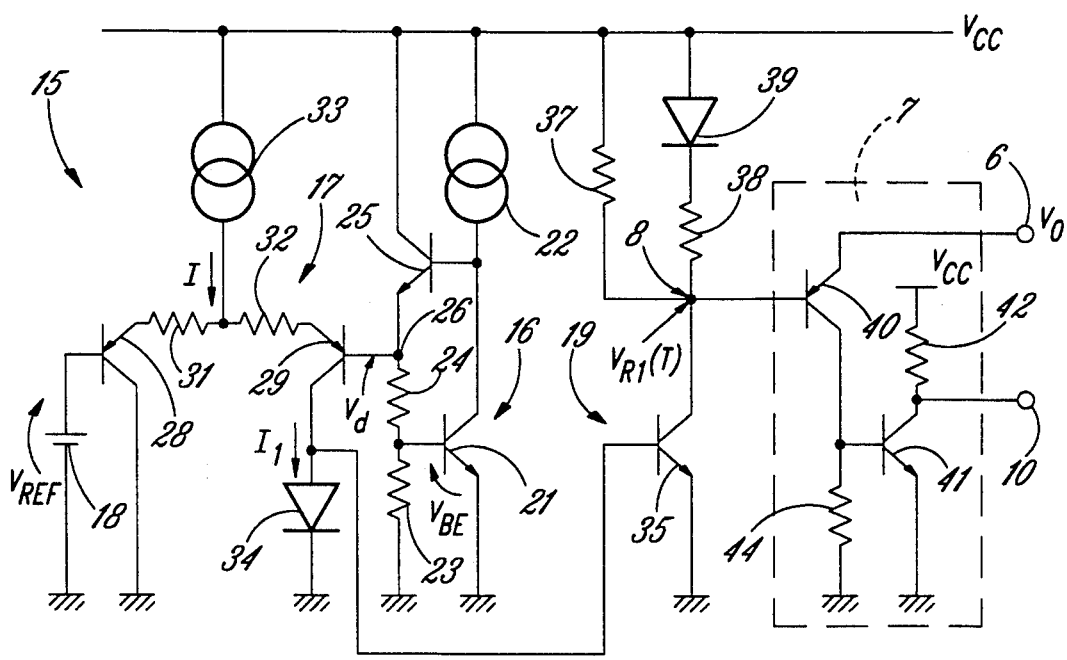
FIG. 3 shows a simplified circuit diagram of part of the FIG. 2 amplifier.

FIG. 3 shows one embodiment of a circuit 15 for generating reference level $V_{R1}$ (and which also applies to $V_{R2}$). As shown in FIG. 3, circuit 15 comprises a temperature sensor 16 generating a voltage $V_d$ depending on the temperature of amplifier 1; a reference voltage source 18 generating a fixed voltage $V_{REF}$; a comparator 17 for comparing $V_d$ and $V_{REF}$ and accordingly generating a current signal; and a current-voltage converting circuit 19 generating a voltage constituting reference level $V_{R1}$.

More specifically, sensor 16 comprises an NPN transistor 21 having the collector terminal connected to supply line $V_{CC}$ (first reference potential line) via a current source 22; the emitter terminal grounded (second reference potential line); and the base terminal connected to the tap between two series connected resistors 23 and 24. Resistor 23 is connected between the base terminal of the transistor 21 and ground; and resistor 24 between the base terminal and the emitter terminal of a further NPN drive transistor 25 having the base terminal connected to the collector terminal of transistor 21, and the collector terminal connected to supply line $V_{CC}$. The emitter terminal of transistor 25 defines the output 26 of sensor 16, which is connected to one input of comparator 17 in turn consisting of two emitter-connected PNP transistors 28, 29, and the other input of which is connected to a voltage source 18. Source 18 may be a so-called band-gap or Zener circuit, for generating a fixed voltage VREF independent of temperature.

Transistor 28, the base terminal of which is connected to source 18, presents a grounded collector terminal, and an emitter terminal connected to that of transistor 29 via two series connected resistors 31 and 32, defining a tap which is connected to the supply line $V_{CC}$ via a current source 33. Transistor 29, the base terminal of which is connected to output 26 of sensor 16, presents a collector terminal connected to the anode of a diode 34 forming part of a current mirror circuit also consisting of an NPN transistor 35 forming part of conversion circuit 19. More specifically, the cathode of diode 34 is grounded, while the anode is also connected to the base terminal of transistor 35, the emitter of which is grounded, and the collector of which defines the reference input 8 of the comparator 7 and is connected to supply line $V_{CC}$ via a network consisting of two resistors 37, 38 and a diode 39. Resistor 37, of resistance R, is connected between the supply line and the reference input 8, and parallel to a branch consisting of the series connection of resistor 38 and diode 39.

In the example shown, the comparator 7 comprises a first PNP transistor 40 having an emitter terminal defining input 6 of the comparator; the base terminal connected to the reference input 8; and the collector connected to the base of an NPN transistor 41, the emitter of which is grounded, and the collector of which is connected to the supply line $V_{CC}$ via a resistor 42. The collector of transistor 41 also defines output of the comparator, and a resistor 44 is provided between the base of transistor 41 and ground.

In the circuit of FIG. 3, transistor 21 is biased to a constant current by the current source 22, and so presents a base-emitter voltage drop VBE which decreases in proportion to an increase in temperature. Assuming that the current source 33 supplies a current I=$V_{CC}$/R, where R is the resistance of resistor 38; that resistor 37 presents a resistance RI>>R; R2 and R3 are the respective resistances of resistors 23 and 24; and resistors 31 and 32 present the same resistance R4; the potential (voltage $V_d$) of point 26 in relation to ground therefore equals:

$$V_d = VBE^* (1+R3/R2)$$

which obviously decreases in proportion to an increase in temperature. which obviously decreases in proportion to an increase in temperature.

The circuit of FIG. 3 may also be so sized that, as long as the temperature of the circuit remains low, the following inequality applies:

$$V_d > V_{REF} + R4 ^* I.$$

As such, transistor 29 is turned off, so that no current circulates in current mirror circuit 34, 35; point 8 presents supply voltage $V_{CC}$; and transistor 40, the base emitter of which respectively present voltage $V_{R1}=V_{CC}$ and voltage $V_O$ (lower than $V_{CC}$) is also turned off, as is transistor 41, the collector of which thus presents the supply voltage (high logic level).

Upon temperature increasing and, consequently, $V_d$ decreasing, so that the following equation applies:

$$V_d = V_{REF} + R4 ^* I$$

transistor 29 is turned on, so as to supply mirror circuit 34, 35 with a current increasing in proportion to a reduction in $V_d$ (i.e., in proportion to an increase in temperature). More specifically, when $V_d=V_{REF}$, the differential 28, 29 is balanced so that current I is divided equally between the two transistors. Consequently, the current I1 supplied to diode 34 equals I/2, i.e., $V_{CC}$/2R, which is mirrored by transistor 35 into resistor 38 (resistor 37 is negligible) so as to produce a voltage drop of $V_{CC}$/2, i.e., equal to the potential of point 8 in relation to ground (voltage $V_{R1}$). Thus, upon output signal $V_O$ exceeding $V_{CC}$/2 (disregarding the base-emitter voltage drop of transistor 40), transistor 40 starts conducting, thus turning on transistor 41, which saturates so that its collector switches to a very low voltage (logic level 0), as shown in FIG. 4.

The advantages of the circuit according to the present invention will be clear from the foregoing description. In particular, unlike the circuit of FIG. 1, by virtue of not being clamped, peak output of the amplifier does not fall in proportion to an increase in temperature, so that no further reduction is effected of low signal levels, and the resulting overall acoustic signal appears less attenuated at high temperature. Moreover, the circuit in no way distorts the signal, and prevents intervention of the thermal cutout system. Finally, the embodiment shown is highly straightforward, and therefore both reliable and economical, and provides for compact, troublefree integration.

To those skilled in the art it will be clear that changes may be made to the amplifier as described and illustrated herein without, however, departing from the scope of the present invention. In particular, in place of a range comparator supplied with two reference levels $V_{R1}$ and $V_{R2}$, the FIG. 2 arrangement may be simplified by employing a straightforward comparator with a single reference voltage, with no appreciable difference in system performance. Changes may also be made to temperature sensor 16 and reference level generating circuit 15, which need not necessarily be as shown in FIG. 3.

We claim:

1. A power amplifier comprising:
   a variable-gain element having a gain control terminal;
   an amplifying stage cascade connected to said variable-gain element and having an output supplying an output signal;
   comparing means for comparing amplitudes having a first input connected to said amplifying stage, and an output connected to said control terminal, said comparing means having a second input connected to said output of said amplifying stage and receiving said output signal and a third input receiving a second electric reference quantity varying with temperature; and
   a variable generating means for generating an electric reference quantity the amplitude of which varies with temperature, said generating means being connected to said first input of said comparing means, said first and second electric reference quantities defining the maximum and minimum permitted level of said output signal.

2. An amplifier as claimed in claim 1 wherein said comparing means comprises a range comparator for generating a first logic level signal when the maximum amplitude of said output signal falls within the range defined by said first and second electric reference quantities, and a second opposite logic level signal when the amplitude of said output signal is above said first electric reference quantity or below said second electric reference quantity.

3. An amplifier as claimed in claim 1, further including a low-pass filter means between said comparing means and said control terminal for filtering said comparing means output.

4. An amplifier as claimed in claim 1 wherein said generating means comprises a variable voltage source, said variable voltage presenting a predetermined level as long as the temperature of the power amplifier remains below a predetermined threshold value, and a level decreasing in proportion to an increase in temperature, when the temperature of the power amplifier exceeds said predetermined threshold value.

5. An amplifier as claimed in claim 4 wherein said generating means comprises:
   a temperature sensor for generating a voltage varying with temperature;
   a voltage source for producing a reference voltage independent of temperature;
   a comparator connected to said temperature sensor and said reference voltage source, for generating a differential output signal as a function of the difference between said variable voltage and said reference voltage; and
   a controlled voltage source receiving said differential signal and generating said electric reference quantity.

6. An amplifier as claimed in claim 5 wherein said temperature sensor comprises a first bipolar transistor biased to a constant current and generating a base-emitter voltage drop decreasing in proportion to an increase in temperature.

7. An amplifier as claimed in claim 5 wherein said comparator comprises a first and second bipolar transistor having mutually connected emitter terminals, and base terminals connected respectively to said temperature sensor and said reference voltage source, said first bipolar transistor having the collector terminal connected to said controlled voltage source, said reference voltage being such that said first bipolar transistor remains off when temperature is below said predetermined threshold value.

8. An amplifier as claimed in claim 5 wherein said controlled voltage source comprises a current mirror having the output terminal connected to a resistive element between said output terminal of said current mirror and a reference potential line.

9. An amplifier as claimed in claim 5 wherein said comparing means comprises a first bipolar transistor having the emitter and base terminals connected between said output of the power amplifier and said controlled voltage source, respectively, and the collector terminal connected to the base terminal connected to a first reference potential line via a resistive element, and the emitter terminal connected to a second reference potential line, said collector terminal defining said output of said comparing means.

10. A power amplifier providing an output signal with thermal overload protection, comprising:
    a variable gain amplifier stage having an input terminal receiving an input signal, a variable gain output terminal, and a control terminal controlling the gain of said variable gain amplifier stage;
    an amplifying stage with an amplifier input terminal coupled to said variable gain output terminal and generating the output signal for the power amplifier; and
    a comparator receiving the output signal and generating a control signal coupled to said control terminal to reduce the gain of said variable gain amplifier stage if the amplitude of said output signal exceeds the amplitude of a first reference signal, said first reference signal generated by a reference generator and having an amplitude that varies proportionally with the temperature of the power amplifier, said reference generator generating a second reference signal having an amplitude that varies proportionally with the temperature of the power amplifier, said first and second reference signals defining a maximum and minimum amplitude range, respectively, of said output signal, whereby the amplitude of the output signal of the power amplifier is maintained within said range.

11. The amplifier of claim 10 wherein said comparator is a range comparator generating a first logic level signal when the maximum amplitude of said output signal is within said amplitude range, and generating a second opposite logic signal if the amplitude of said output signal exceeds the amplitude of a first reference signal, or is less than the amplitude of said second reference signal.

12. The amplifier of claim 10 wherein said reference generator provides said comparator with a signal whose amplitude remains constant if the temperature of the amplifier is below a predetermined threshold, and decreases in proportion to increases in temperature when the temperature of the amplifier exceeds said predetermined threshold.

13. The amplifier of claim 12 wherein said reference generator comprises:
 a temperature sensor generating a voltage varying with temperature;
 a voltage source generating a temperature-independent reference voltage;
 a reference comparator coupled to said temperature sensor and said voltage source generating a differential signal that varies as a function of the difference between said varying voltage and said temperature-independent voltage; and
 a controlled voltage source receiving said differential signal and generating said first reference voltage.

14. The amplifier of claim 10, further including a low pass filter having a filter input coupled to said control signal and a filter output coupled to said control terminal.

15. The amplifier of claim 10 wherein said variable gain amplifier stage contains a plurality of discrete gain steps.

16. A method of protecting a power amplifier from thermal overload damage, the method comprising the steps of:
 (a) measuring a temperature value of the amplifier using a temperature sensor;
 (b) generating a first reference voltage that varies in proportion to said temperature value;
 (c) generating a second reference voltage that varies in proportion to said temperature value;
 (d) comparing an output voltage from the amplifier to said first and second reference voltages, said first and second reference voltages defining a range of amplitudes of said output voltage; and
 (e) varying the amplitude of said output voltage so that the amplitude of said output voltage is maintained within said range.

17. The method of claim 16 wherein step (b) or generating said first reference voltage adjusts said first reference voltage in proportion to changes in said temperature value if said temperature value exceeds a predetermined threshold.

18. The method of claim 16 wherein step (b) of generating said first reference voltage includes the steps of:
 (1) generating a voltage that varies with said temperature value;
 (b 2) generating a temperature-independent reference voltage;
 (b 3) comparing said varying voltage with said temperature-independent reference voltage and generating a differential signal as a function of the difference between said varying voltage and said temperature-independent reference voltage; and
 (4) generating said first reference voltage from said differential signal.

* * * * *

UNITED STATES PATENT AND TRADEMARK OFFICE
CERTIFICATE OF CORRECTION

PATENT NO. : 5,315,268
DATED : May 24, 1994
INVENTOR(S) : Edoardo Botti and Claudio Tavazzani It is certified that error appears in the above-identified patent and that said Letters Patent is hereby corrected as shown below:

In claim 9, column 6, line 34, after "base terminal" and before "connected", please insert --of a second bipolar transistor having the collector terminal--.

Signed and Sealed this

Thirteenth Day of September, 1994

BRUCE LEHMAN